(12) United States Patent
Hong

(10) Patent No.: US 11,188,109 B1
(45) Date of Patent: Nov. 30, 2021

(54) DEVICES CONFIGURED TO CONDUCT A POWER GATING OPERATION

(71) Applicant: SK hynix Inc., Icheon-si (KR)

(72) Inventor: Yun Seok Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/151,478

(22) Filed: Jan. 18, 2021

(30) Foreign Application Priority Data

Aug. 10, 2020 (KR) ........................ 10-2020-0099606

(51) Int. Cl.
  G05F 1/46 (2006.01)
  G05F 1/66 (2006.01)
  H03K 17/687 (2006.01)

(52) U.S. Cl.
  CPC ............. *G05F 1/66* (2013.01); *H03K 17/687* (2013.01)

(58) Field of Classification Search
  None
  See application file for complete search history.

(56) References Cited

U.S. PATENT DOCUMENTS

| 5,550,494 | A * | 8/1996 | Sawada | H03K 17/693 327/69 |
| 5,818,783 | A * | 10/1998 | Kim | G11C 5/143 365/226 |
| 6,452,854 | B1 * | 9/2002 | Kato | H01L 27/092 365/226 |
| 7,271,504 | B2 * | 9/2007 | Wada | H03K 17/223 307/85 |
| 7,379,373 | B2 * | 5/2008 | Lorenz | G11C 5/14 365/226 |
| 7,612,615 | B1 | 11/2009 | Hou | |
| 8,013,473 | B2 * | 9/2011 | Frew | H02J 1/10 307/87 |
| 8,653,884 | B2 * | 2/2014 | Miwa | G05F 3/02 327/538 |
| 9,323,272 | B2 * | 4/2016 | Rana | G05F 3/16 |
| 10,326,402 | B2 * | 6/2019 | Shimizu | H03B 1/04 |
| 10,452,113 | B2 * | 10/2019 | Au Yeung | H02M 3/33523 |
| 2013/0321071 | A1 * | 12/2013 | Pietri | H03K 17/22 327/540 |
| 2015/0108842 | A1 * | 4/2015 | Chen | H02J 1/108 307/52 |

FOREIGN PATENT DOCUMENTS

KR   1020170067816 A   6/2017

* cited by examiner

*Primary Examiner* — Thomas J. Hiltunen
(74) *Attorney, Agent, or Firm* — William Park & Associates Ltd.

(57) ABSTRACT

A device performing a power gating operation includes a switch control signal generation circuit and a power gating circuit. The switch control signal generation circuit controls an operation that generates a first switch control signal and a second switch control signal from a mode signal based on a comparison result of a first power source voltage and a second power source voltage until a mode register set operation is performed after a power-up period ends. The power gating circuit drives a power source voltage to the first power source voltage or the second power source voltage based on the first switch control signal and the second switch control signal.

24 Claims, 13 Drawing Sheets

FIG.11

| TCNT | DVFS_MRS | SW_CNT1 | SW_CNT2 | VDDS |
|---|---|---|---|---|
| H | L | H | L | VDD1 |
|   | H | L | H | VDD2 |

DEVICES CONFIGURED TO CONDUCT A POWER GATING OPERATION

CROSS-REFERENCE TO RELATED APPLICATIONS

The present application claims priority under 35 U.S.C 119(a) to Korean Application No. 10-2020-0099606, filed on Aug. 10, 2020, which is incorporated herein by reference in its entirety.

BACKGROUND

1. Technical Field

Embodiments of the present disclosure relate to devices configured to conduct a power gating operation.

2. Related Art

Semiconductor devices employed in portable electronic devices have been designed to perform a power gating operation to prevent unnecessary electric power from being consumed. The power gating operation may include an operation for inhibiting the unnecessary electric power from being supplied and an operation for converting a level of a power source voltage into various different voltage levels.

SUMMARY

According to an embodiment, a device may include a switch control signal generation circuit and a power gating circuit. The switch control signal generation circuit may be configured to control an operation generating a first switch control signal and a second switch control signal from a mode signal based on a comparison result of a first power source voltage and a second power source voltage until a mode register set operation is performed after a power-up period ends. The power gating circuit may be configured to drive a power source voltage to the first power source voltage or the second power source voltage based on the first switch control signal and the second switch control signal.

According to another embodiment, a device may include a mode control signal generation circuit, a switch control signal drive circuit, and a power gating circuit. The mode control signal generation circuit may be configured to generate a mode control signal based on a comparison result of a first power source voltage and a second power source voltage until a mode register set operation is performed after a power-up period ends. The switch control signal drive circuit may be configured to generate a first switch control signal and a second switch control signal based on the mode control signal and a mode signal. The power gating circuit may be configured to drive a power source voltage to the first power source voltage according to a level of the power source voltage when the first switch control signal is activated and is configured to drive the power source voltage to the second power source voltage when the second switch control signal is activated.

BRIEF DESCRIPTION OF THE DRAWINGS

FIGS. 6, 7, 8, 9, 10, 11, 12, and 13 illustrate operations of the device illustrated in FIGS. 1 to 5.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
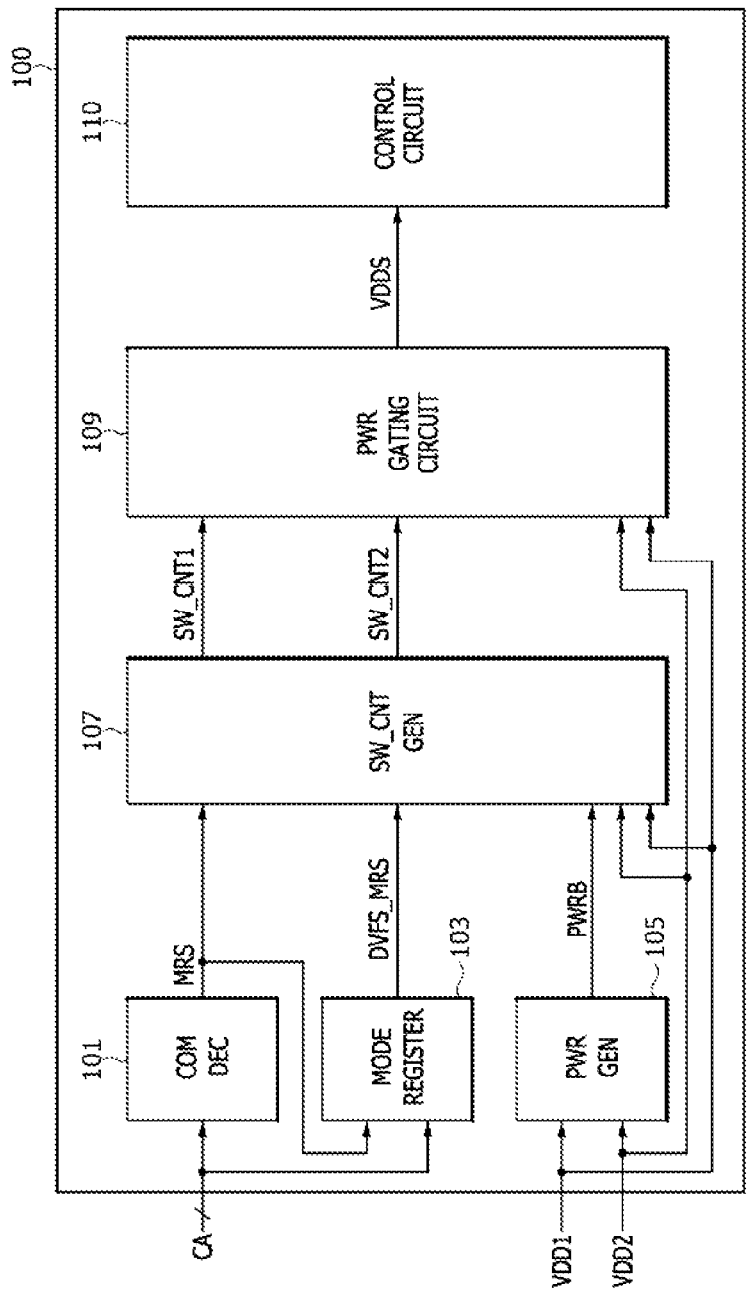
FIG. 1 is a block diagram illustrating a configuration of a device according to an embodiment of the present disclosure.

As illustrated in FIG. 1, a device 100 according to an embodiment may include a command decoder (COM_DEC) 101, a mode register 103, a power-up signal generation circuit (PWR_GEN) 105, a switch control signal generation circuit (SW_CNT_GEN) 107, a power gating circuit 109, and a control circuit 110. In an embodiment, the device 100 may be a semiconductor device.

The command decoder 101 may generate a mode register set signal MRS based on a set signal CA. The set signal CA may include a command and an address which are provided by an external device (not shown). The external device may be located to be separated from the device 100, and the external device may include a host and a controller. The command decoder 101 may decode the command included in the set signal CA to generate the mode register set signal MRS which is activated to perform a mode register set operation. Information on various internal operations of the device 100 may be stored in the mode register 103 through the mode register set operation. The information on the various internal operations may include information on a burst length, information on a latency, mode information for a power gating operation, and the like.

The mode register 103 may receive the mode register set signal MRS from the command decoder 101. When the mode register set operation is performed, the mode register 103 may extract and store the mode information (for the power gating operation) included in the set signal CA and may output the stored mode information as a mode signal DVFS_MRS. A logic level of the mode signal DVFS_MRS may be set such that a level of a power source voltage VDDS supplied to the control circuit 110 is adjusted according to a frequency. The mode signal DVFS_MRS may be set to have a first logic level or a second logic level for dynamic voltage frequency scaling (DVFS). The mode signal DVFS_MRS may be set to have the first logic level to drive the power source voltage VDDS supplied to the control circuit 110 to a first power source voltage VDD1 at a high frequency and may be set to have the second logic level to drive the power source voltage VDDS supplied to the control circuit 110 to a second power source voltage VDD2 at a low frequency. The first power source voltage VDD1 and the second power source voltage VDD2 may be power source voltages provided by an external device, and the first power source voltage VDD1 may be set to be higher than the second power source voltage VDD2. The high frequency means a frequency which is higher than a predetermined frequency, and the low frequency means a frequency which is lower than the predetermined frequency. Although the present embodiment is described in conjunction with a case that the first logic level is a logic "low" level and the second logic level is a logic "high" level, the present embodiment is merely an example of the present disclosure. Accordingly, the present disclosure is not limited to the case that the first logic level is a logic "low" level and the second logic level is a logic "high" level.

The power-up signal generation circuit 105 may receive the first power source voltage VDD1 and the second power source voltage VDD2 from the external device. The power-up signal generation circuit 105 may generate a power-up signal PWRB based on the first power source voltage VDD1 and the second power source voltage VDD2. The power-up signal generation circuit 105 may generate the power-up signal PWRB having the first logic level during a power-up period and may generate the power-up signal PWRB having a level that changes from the first logic level into the second logic level when the power-up period ends. In an embodiment, although the power-up period is set as a period from a point in time when the first power source voltage VDD1 and the second power source voltage VDD2 are applied to the power-up signal generation circuit 105 until a point in time when both of the first power source voltage VDD1 and the second power source voltage VDD2 are boosted to be higher than a predetermined target level, the present disclosure is not limited thereto. For example, in some other embodiments, the power-up period may be set as a period from a point in time when the first power source voltage VDD1 or the second power source voltage VDD2 is applied to the power-up signal generation circuit 105 until a point in time when the first power source voltage VDD1 or the second power source voltage VDD2 is boosted to be higher than the predetermined target level.

The switch control signal generation circuit 107 may receive the mode register set signal MRS from the command decoder 101, may receive the mode signal DVFS_MRS from the mode register 103, and may receive the power-up signal PWRB from the power-up signal generation circuit 105. The switch control signal generation circuit 107 may also receive the first power source voltage VDD1 and the second power source voltage VDD2 from the external device. The switch control signal generation circuit 107 may perform an initialization operation based on the power-up signal PWRB during the power-up period that the power-up signal PWRB is set to have the first logic level. The initialization operation may be performed to initialize internal nodes to predetermined logic levels. The switch control signal generation circuit 107 may control an operation that compares logic levels of the first power source voltage VDD1 and the second power source voltage VDD2 with each other to generate a first switch control signal SW_CNT1 and a second switch control signal SW_CNT2 from the mode signal DVFS_MRS until the mode register set operation is performed after the power-up period terminates. In an embodiment, if the mode register set operation is performed while the first power source voltage VDD1 is higher than the second power source voltage VDD2, the switch control signal generation circuit 107 may generate the first switch control signal SW_CNT1 and the second switch control signal SW_CNT2, one of which is selectively activated according to a logic level of the mode signal DVFS_MRS. That is, when the mode signal DVFS_MRS has the first logic level, the switch control signal generation circuit 107 may generate the first switch control signal SW_CNT1 which is activated and the second switch control signal SW_CNT2 which is inactivated. In addition, when the mode signal DVFS_MRS has the second logic level, the switch control signal generation circuit 107 may generate the first switch control signal SW_CNT1 which is inactivated and the second switch control signal SW_CNT2 which is activated. Logic levels of the first switch control signal SW_CNT1 and the second switch control signal SW_CNT2 which are activated may be set to be different according to the embodiments. In some other embodiments, if the mode register set operation is performed while the first power source voltage VDD1 is lower than the second power source voltage VDD2, the switch control signal generation circuit 107 may generate the first switch control signal SW_CNT1 which is activated and the second switch control signal SW_CNT2 which is inactivated, regardless of a logic level of the mode signal DVFS_MRS.

The power gating circuit 109 may receive the first switch control signal SW_CNT1 and the second switch control signal SW_CNT2 from the switch control signal generation circuit 107 and may receive the first power source voltage VDD1 and the second power source voltage VDD2 from the external device. The power gating circuit 109 may drive the power source voltage VDDS supplied to the control circuit 110 to the first power source voltage VDD1 when the first switch control signal SW_CNT1 is activated. The power gating circuit 109 may drive the power source voltage VDDS supplied to the control circuit 110 to the second power source voltage VDD2 when the second switch control signal SW_CNT2 is activated. The power gating circuit 109 may detect a level of the power source voltage VDDS to drive the power source voltage VDDS to the first power source voltage VDD1 when the first switch control signal SW_CNT1 is activated. In an embodiment, when the first switch control signal SW_CNT1 is activated, the power gating circuit 109 may drive the power source voltage VDDS to the first power source voltage VDD1 to reduce power consumption of the device 100 only when a level of the power source voltage VDDS becomes lower than a predetermined level.

The control circuit 110 may receive the power source voltage VDDS from the power gating circuit 109. The control circuit 110 may control various internal operations. For example, the control circuit 110 may be realized using circuits for controlling operations that receive and output data. The control circuit 110 may receive the power source voltage VDDS, a level of which is adjusted according to a frequency, to control an internal operation of the device 100. The power source voltage VDDS supplied to the control circuit 110 may be set to have a high level at a high frequency by the dynamic voltage frequency scaling (DVFS) and may be set to have a low level at a low frequency by the dynamic voltage frequency scaling (DVFS). The power source voltage VDDS supplied to the control circuit 110 may be driven to the first power source voltage VDD1 regardless of the frequency when the first power source voltage VDD1 and the second power source voltage VDD2 have the same level.

Figure 2:
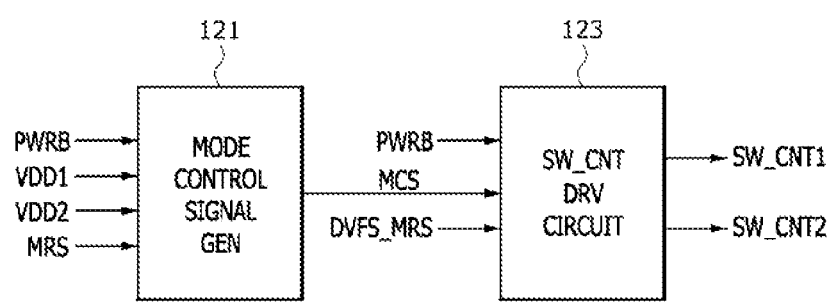
FIG. 2 is a block diagram illustrating a configuration of a switch control signal generation circuit included in the device illustrated in FIG. 1.

As illustrated in FIG. 2, the switch control signal generation circuit 107 may include a mode control signal generation circuit 121 and a switch control signal drive circuit 123.

The mode control signal generation circuit 121 may receive the power-up signal PWRB from the power-up signal generation circuit (105 of FIG. 1), may receive the first power source voltage VDD1 and the second power source voltage VDD2 from the external device, and may receive the mode register set signal MRS from the command decoder (101 of FIG. 1). The mode control signal generation circuit 121 may generate a mode control signal MCS based on the power-up signal PWRB, the first power source voltage VDD1, the second power source voltage VDD2, and the mode register set signal MRS. The mode control signal generation circuit 121 may generate the mode control signal MCS which is inactivated during the power-up period. The mode control signal generation circuit 121 may detect levels of the first power source voltage VDD1 and the second power source voltage VDD2 to generate the mode control signal MCS until the mode register set operation is performed after the power-up period ends. For example, the mode control signal generation circuit 121 may generate the mode control signal MCS which is inactivated when the first power source voltage VDD1 is higher than the second power source voltage VDD2 and may generate the mode control signal MCS which is activated when the first power source voltage VDD1 is equal to or lower than the second power source voltage VDD2. After the mode register set operation is performed, the mode control signal generation circuit 121 may generate the mode control signal MCS maintaining an inactivated state regardless of levels of the first power source voltage VDD1 and the second power source voltage VDD2.

The switch control signal drive circuit 123 may receive the power-up signal PWRB from the power-up signal generation circuit (105 of FIG. 1), may receive the mode control signal MCS from the mode control signal generation circuit 121, and may receive the mode signal DVFS_MRS from the mode register (103 of FIG. 1). The switch control signal drive circuit 123 may generate the first switch control signal SW_CNT1 and the second switch control signal SW_CNT2 based on the power-up signal PWRB, the mode control signal MCS, and the mode signal DVFS_MRS. The switch control signal drive circuit 123 may perform the initialization operation based on the power-up signal PWRB during the power-up period. Until the mode register set operation is performed after the power-up period ends, the switch control signal drive circuit 123 may receive the mode control signal MCS to determine whether the first switch control signal SW_CNT1 and the second switch control signal SW_CNT2 are generated according to the mode signal DVFS_MRS or regardless of the mode signal DVFS_MRS after the mode register set operation. In an embodiment, when the mode register set operation is performed while the mode control signal MCS is inactivated, the switch control signal drive circuit 123 may generate the first switch control signal SW_CNT1 and the second switch control signal SW_CNT2, one of which is selectively activated according to the mode signal DVFS_MRS. Alternatively, when the mode register set operation is performed while the mode control signal MCS is activated, the switch control signal drive circuit 123 may generate the first switch control signal SW_CNT1 which is activated and the second switch control signal SW_CNT2 which is inactivated, regardless of the mode signal DVFS_MRS.

Figure 3:
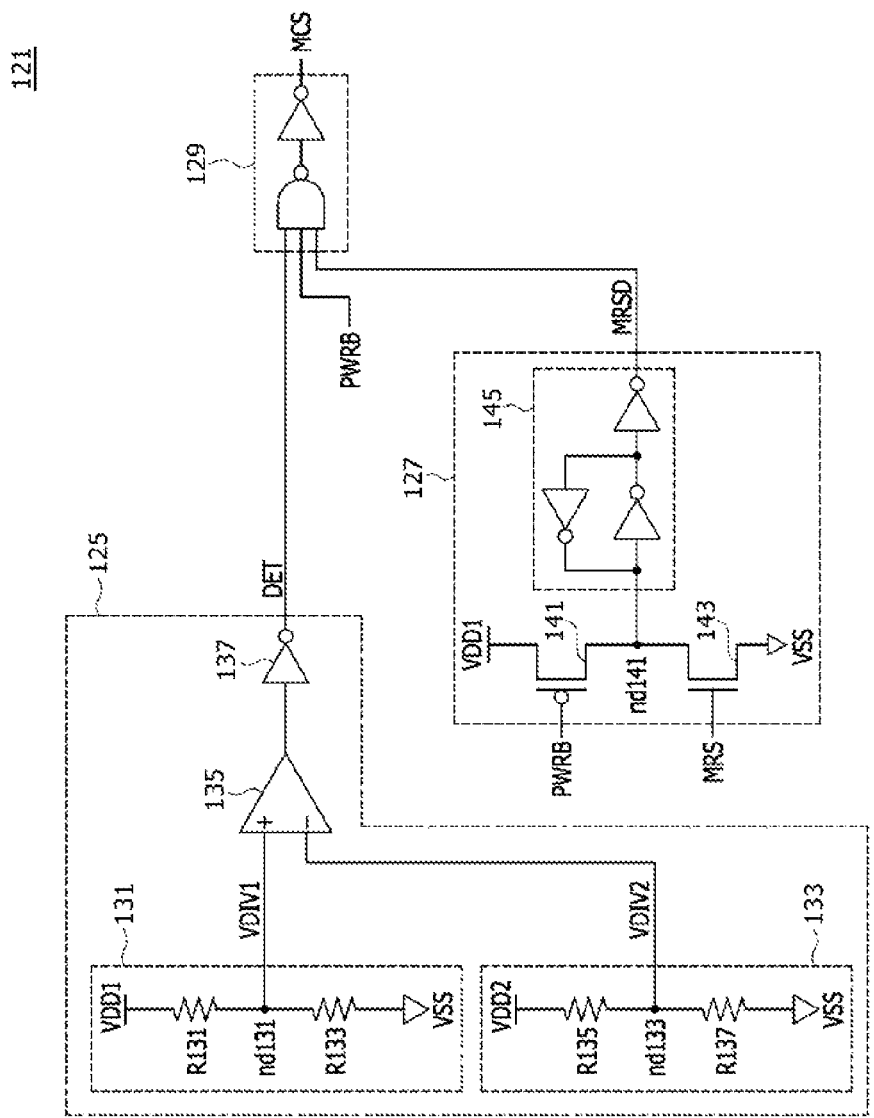
FIG. 3 is a circuit diagram illustrating a mode control signal generation circuit included in the switch control signal generation circuit illustrated in FIG. 2.

As illustrated in FIG. 3, the mode control signal generation circuit 121 may include a voltage detection signal generation circuit 125, an operation detection signal generation circuit 127, and a mode control signal output circuit 129.

The voltage detection signal generation circuit 125 may include a first divided voltage generation circuit 131, a second divided voltage generation circuit 133, a voltage comparator 135, and an inversion buffer 137. The first divided voltage generation circuit 131 may include resistive elements R131 and R133 coupled in series between a supply terminal of the first power source voltage VDD1 and a supply terminal of a ground voltage VSS and may divide the first power source voltage VDD1 based on resistance values of the resistive elements R131 and R133 to generate and output a first divided voltage VDIV1 through a node nd131 between the resistive elements R131 and R133. The second divided voltage generation circuit 133 may include resistive elements R135 and R137 coupled in series between a supply terminal of the second power source voltage VDD2 and the supply terminal of the ground voltage VSS and may divide the second power source voltage VDD2 based on resistance values of the resistive elements R135 and R137 to generate and output a second divided voltage VDIV2 through a node nd133 between the resistive elements R135 and R137. In the present embodiment, the resistive elements R131, R133, R135, and R137 may have the same resistance value. Thus, a ratio of the first divided voltage VDIV1 to the first power source voltage VDD1 may be set to be equal to a ratio of the second divided voltage VDIV2 to the second power source voltage VDD2. The voltage comparator 135 may compare the first divided voltage VDIV1 with the second divided voltage VDIV2. In an embodiment, the voltage comparator 135 may output a signal having a logic "high" level when the first divided voltage VDIV1 is higher than the second divided voltage VDIV2 and may output a signal having a logic "low" level when the first divided voltage VDIV1 is equal to or lower than the second divided voltage VDIV2. The inversion buffer 137 may inversely buffer an output signal of the voltage comparator 135 to generate and output a voltage detection signal DET. The voltage detection signal generation circuit 125 may compare the first divided voltage VDIV1 with the second divided voltage VDIV2 to generate the voltage detection signal DET. The voltage detection signal generation circuit 125 may generate the voltage detection signal DET having a logic "low" level when the first divided voltage VDIV1 is higher than the second divided voltage VDIV2 and may generate the voltage detection signal DET having a logic "high" level when the first divided voltage VDIV1 is equal to or lower than the second divided voltage VDIV2.

The operation detection signal generation circuit 127 may include a pull-up driver 141, a pull-down driver 143, and an operation detection signal latch circuit 145. The pull-up driver 141 may be coupled between the supply terminal of the first power source voltage VDD1 and a node nd141, and the pull-down driver 143 may be coupled between the node nd141 and the supply terminal of the ground voltage VSS. The operation detection signal latch circuit 145 may be coupled to the node nd141. The pull-up driver 141 may pull up a level of the node nd141 based on the power-up signal PWRB. The pull-up driver 141 may be realized using a PMOS transistor. In such a case, the PMOS transistor may be turned on by the power-up signal PWRB having a logic "low" level during the power-up period to pull up the node nd141 to the first power source voltage VDD1. The pull-down driver 143 may pull down a level of the node nd141 based on the mode register set signal MRS. The pull-down driver 143 may be realized using an NMOS transistor. In such a case, the NMOS transistor may be turned on by the mode register set signal MRS having a logic "high" level by the mode register set operation to pull down the node nd141 to the ground voltage VSS. The operation detection signal latch circuit 145 may latch and buffer a signal of the node nd141 to generate an operation detection signal MRSD. The operation detection signal generation circuit 127 may initialize the operation detection signal MRSD to a logic "high" level during the power-up period. The operation detection signal generation circuit 127 may generate the operation detection signal MRSD maintaining a logic "low" level after the mode register set operation is performed.

The mode control signal output circuit 129 may receive the voltage detection signal DET from the voltage detection signal generation circuit 125, may receive the power-up signal PWRB from the power-up signal generation circuit (105 of FIG. 1), and may receive the operation detection signal MRSD from the operation detection signal generation circuit 127. The mode control signal output circuit 129 may generate the mode control signal MCS based on the voltage detection signal DET, the power-up signal PWRB, and the operation detection signal MRSD. The mode control signal output circuit 129 may generate the mode control signal MCS which is inactivated to have a logic "low" level according to the power-up signal PWRB having a logic "low" level during the power-up period. The mode control signal output circuit 129 may generate the mode control signal MCS based on the voltage detection signal DET generated by detecting levels of the first power source voltage VDD1 and the second power source voltage VDD2 until the mode register set operation is performed after the power-up period terminates. For example, the mode control signal output circuit 129 may generate the mode control signal MCS which is inactivated to have a logic "low" level by the voltage detection signal DET having a logic "low" level when the first power source voltage VDD1 is higher than the second power source voltage VDD2. In addition, the mode control signal output circuit 129 may generate the mode control signal MCS which is activated to have a logic "high" level by the voltage detection signal DET having a logic "high" level when the first power source voltage VDD1 is equal to or lower than the second power source voltage VDD2. The mode control signal output circuit 129 may generate the mode control signal MCS maintaining an inactivated state (i.e., a logic "low" level) by the operation detection signal MRSD having a logic "low" level after the mode register set operation is performed.

Figure 4:
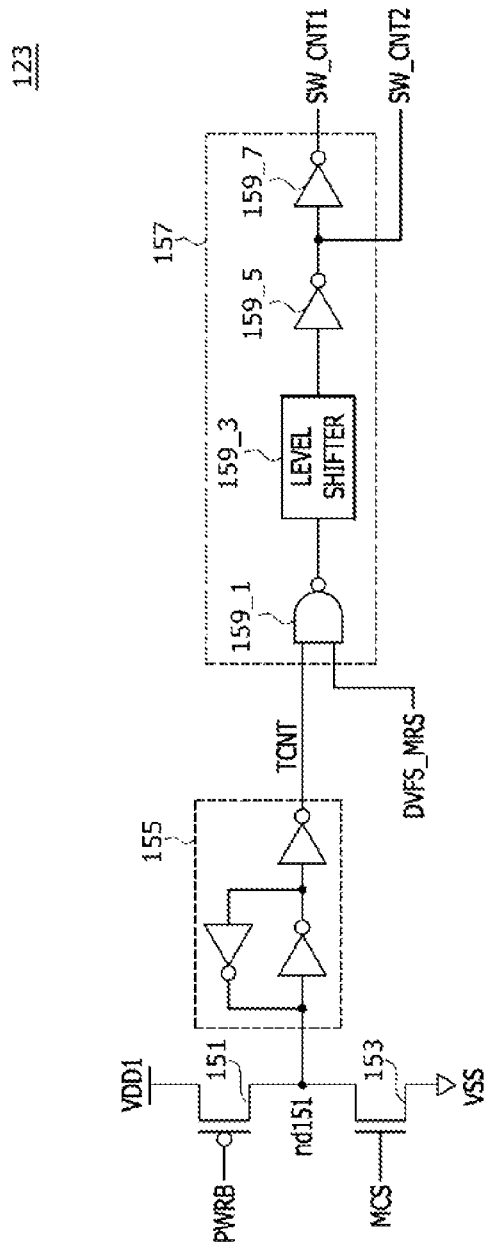
FIG. 4 illustrates a switch control signal drive circuit included in the switch control signal generation circuit illustrated in FIG. 2.

As illustrated in FIG. 4, the switch control signal drive circuit 123 may include a first driver 151, a second driver 153, a transmission control signal generation circuit 155, and a switch control signal output circuit 157. The first driver 151 may be coupled between the supply terminal of the first power source voltage VDD1 and a node nd151, and the second driver 153 may be coupled between the node nd151 and the supply terminal of the ground voltage VSS. The transmission control signal generation circuit 155 may be coupled to the node nd151.

The first driver 151 may pull up a level of the node nd151 based on the power-up signal PWRB. The first driver 151 may be realized using a PMOS transistor. In such a case, the PMOS transistor may be turned on by the power-up signal PWRB having a logic "low" level during the power-up period to pull up the node nd151 to the first power source voltage VDD1. The second driver 153 may pull down a level of the node nd151 based on the mode control signal MCS. The second driver 153 may be realized using an NMOS transistor. In such a case, the NMOS transistor may be turned on by the mode control signal MCS activated to have a logic "high" level to pull down the node nd151 to the ground voltage VSS.

The transmission control signal generation circuit 155 may latch and buffer a signal of the node nd151 to generate a transmission control signal TCNT. The transmission control signal generation circuit 155 may initialize the transmission control signal TCNT to a logic "high" level when the node nd151 is pulled up to have the first power source voltage VDD1 by the power-up signal PWRB having a logic "low" level during the power-up period. The transmission control signal generation circuit 155 may generate the transmission control signal TCNT having a logic "low" level when the node nd151 is pulled down to have the ground voltage VSS by the mode control signal MCS activated to have a logic "high" level until the mode register set operation is performed after the power-up period terminates. The transmission control signal generation circuit 155 may maintain the transmission control signal TCNT having a logic "high" level when the mode control signal MCS is inactivated to have a logic "low" level.

The switch control signal output circuit 157 may include a transfer element 159_1, a level shifter 159_3, a first inversion buffer 159_5, and a second inversion buffer 159_7. The transfer element 159_1 may be realized using a NAND gate performing a logical NAND operation of the transmission control signal TCNT and the mode signal DVFS_MRS. The transfer element 159_1 may inversely buffer the mode signal DVFS_MRS to output the inversely buffered signal of the mode signal DVFS_MRS when the transmission control signal TCNT has a logic "high" level. The transfer element 159_1 may output a signal having a logic "high" level regardless of the mode signal DVFS_MRS when the transmission control signal TCNT has a logic "low" level. The level shifter 159_3 may shift a level of an output signal of the transfer element 159_1 to output the shifted level of the output signal of the transfer element 159_1. A configuration of the switch control signal output circuit 157 including the level shifter 159_3 may be merely an example of the present disclosure. Accordingly, the switch control signal output circuit 157 is not limited to the example illustrated in FIG. 4. The first inversion buffer 159_5 may inversely buffer an output signal of the level shifter 159_3 to generate and output the second switch control signal SW_CNT2. The second inversion buffer 159_7 may inversely buffer an output signal of the first inversion buffer 159_5 to generate and output the first switch control signal SW_CNT1.

The switch control signal drive circuit 123 may perform the initialization operation for initializing the transmission control signal TCNT to a logic "high" level based on the power-up signal PWRB having a logic "low" level during the power-up period. The switch control signal drive circuit 123 may generate the first switch control signal SW_CNT1 and the second switch control signal SW_CNT2 after the mode register set operation based on the mode control signal MCS inputted to the switch control signal drive circuit 123 until the mode register set operation is performed after the power-up period ends. For example, the switch control signal drive circuit 123 may generate the first switch control signal SW_CNT1 and the second switch control signal SW_CNT2, one of which is selectively activated according to the mode signal DVFS_MRS when the mode register set operation is performed while the mode control signal MCS is inactivated to have a logic "low" level. For example, the switch control signal drive circuit 123 may generate the first switch control signal SW_CNT1 which is activated to have a logic "high" level and the second switch control signal SW_CNT2 which is inactivated to have a logic "low" level when the mode signal DVFS_MRS has a logic "low" level. Alternatively, the switch control signal drive circuit 123 may generate the first switch control signal SW_CNT1 which is inactivated to have a logic "low" level and the second switch control signal SW_CNT2 which is activated to have a logic "high" level when the mode signal DVFS_MRS has a logic "high" level. The switch control signal drive circuit 123 may generate the first switch control signal SW_CNT1 which is activated to have a logic "high" level and the second switch control signal SW_CNT2 which is inactivated to have a logic "low" level regardless of a logic level of the mode signal DVFS_MRS when the mode register set operation is performed while the mode control signal MCS is activated to have a logic "high" level.

Figure 5:
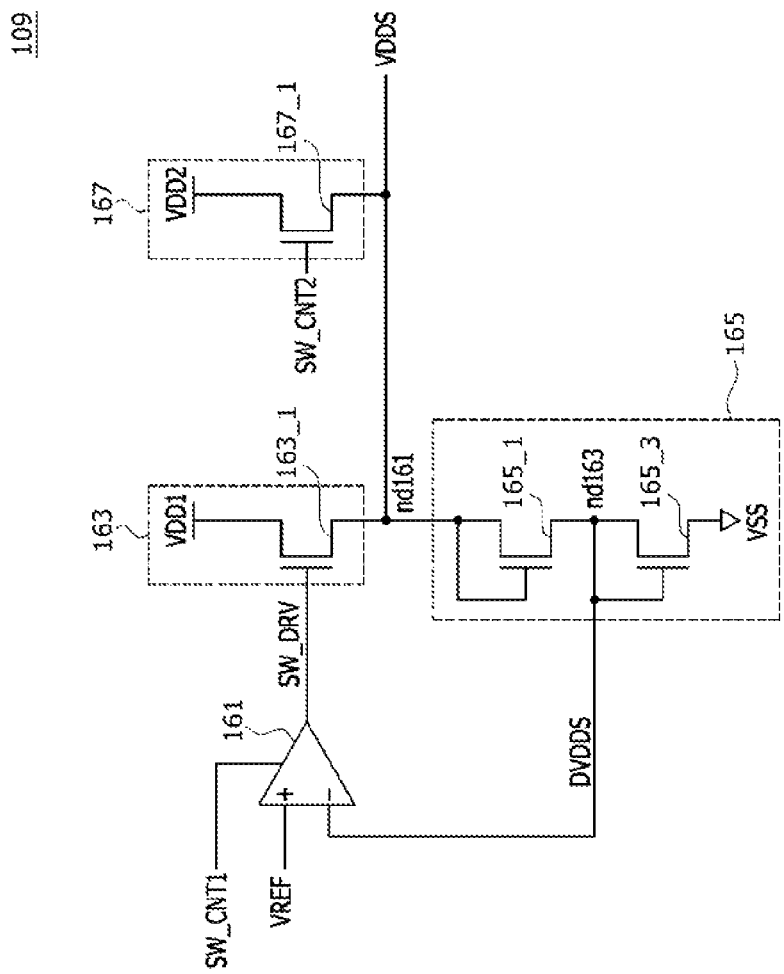
FIG. 5 is a circuit diagram illustrating a power gating circuit included in the device illustrated in FIG. 1.

As illustrated in FIG. 5, the power gating circuit 109 may include a switch drive signal generation circuit 161, a first power source voltage drive circuit 163, a power source voltage division circuit 165, and a second power source voltage drive circuit 167.

The switch drive signal generation circuit 161 may receive the first switch control signal SW_CNT1 from the switch control signal generation circuit 107 and may receive a divided power source voltage DVDDS from the power source voltage division circuit 165. The switch drive signal generation circuit 161 may generate a switch drive signal SW_DRV based on the first switch control signal SW_CNT1, a reference voltage VREF, and the divided power source voltage DVDDS. The reference voltage VREF may be set to have a constant level. The switch drive signal generation circuit 161 may generate the switch drive signal SW_DRV which is inactivated to have a logic "low" level when the first switch control signal SW_CNT1 is inactivated to have a logic "low" level. The switch drive signal generation circuit 161 may compare a level of the divided power source voltage DVDDS with a level of the reference voltage VREF to generate the switch drive signal SW_DRV when the first switch control signal SW_CNT1 is activated to have a logic "high" level. In an embodiment, the switch drive signal generation circuit 161 may generate the switch drive signal SW_DRV which is activated to have a logic "high" level when the divided power source voltage DVDDS is lower than the reference voltage VREF while the first switch control signal SW_CNT1 is activated to have a logic "high" level. Alternatively, the switch drive signal generation circuit 161 may generate the switch drive signal SW_DRV which is inactivated to have a logic "low" level when the divided power source voltage DVDDS is equal to or higher than the reference voltage VREF while the first switch control signal SW_CNT1 is activated to have a logic "high" level.

The first power source voltage drive circuit 163 may receive the switch drive signal SW_DRV from the switch drive signal generation circuit 161. In an embodiment, the first power source voltage drive circuit 163 may be realized using an NMOS transistor 163_1 which is coupled between the supply terminal of the first power source voltage VDD1 and a node nd161. The first power source voltage drive circuit 163 may drive the power source voltage VDDS outputted through the node nd161 to the first power source voltage VDD1 when the switch drive signal SW_DRV is activated to have a logic "high" level. The first power source voltage drive circuit 163 may receive the switch drive signal SW_DRV, which is activated to have a logic "high" level, to drive the power source voltage VDDS to the first power source voltage VDD1 when the mode signal DVFS_MRS is set to have a logic "low" level by the mode register set operation and the divided power source voltage DVDDS is lower than the reference voltage VREF while the first power source voltage VDD1 is higher than the second power source voltage VDD2. The first power source voltage drive circuit 163 may receive the switch drive signal SW_DRV, which is inactivated to have a logic "low" level, to inhibit the power source voltage VDDS from being driven when the mode signal DVFS_MRS is set to have a logic "low" level by the mode register set operation and the divided power source voltage DVDDS is equal to or higher than the reference voltage VREF while the first power source voltage VDD1 is higher than the second power source voltage VDD2. The first power source voltage drive circuit 163 may drive the power source voltage VDDS to the first power source voltage VDD1 only when the divided power source voltage DVDDS is lower than the reference voltage VREF regardless of a level of the mode signal DVFS_MRS while the first power source voltage VDD1 and the second power source voltage VDD2 have the same level.

The power source voltage division circuit 165 may include a first power source voltage division element 165_1 and a second power source voltage division element 165_3 which are coupled in series. The first power source voltage division element 165_1 may be realized using an NMOS transistor that is coupled between the node nd161 and a node nd163 to function as a resistive element. In such a case, the NMOS transistor acting as the first power source voltage division element 165_1 may have a gate and a drain which are electrically coupled to each other. The second power source voltage division element 165_3 may be realized using an NMOS transistor that is coupled between the node nd163 and the supply terminal of the ground voltage VSS to function as a resistive element. In such a case, the NMOS transistor acting as the second power source voltage division element 165_3 may have a gate and a drain which are electrically coupled to each other. The power source voltage division circuit 165 may divide the power source voltage VDDS according to a ratio of a resistance value of the first power source voltage division element 165_1 to a resistance value of the second power source voltage division element 165_3 to generate the divided power source voltage DVDDS which is outputted through the node nd163. The power source voltage division circuit 165 may generate the divided power source voltage DVDDS having a half level of the power source voltage VDDS when the first power source voltage division element 165_1 and the second power source voltage division element 165_3 have the same resistance value.

The second power source voltage drive circuit 167 may receive the second switch control signal SW_CNT2 from the switch control signal generation circuit (107 of FIG. 1). In an embodiment, the second power source voltage drive circuit 167 may be realized using an NMOS transistor 167_1 which is coupled between the supply terminal of the second power source voltage VDD2 and the node nd161. The second power source voltage drive circuit 167 may drive the power source voltage VDDS outputted through the node nd161 to the second power source voltage VDD2 when the second switch control signal SW_CNT2 is activated to have a logic "high" level. The second power source voltage drive circuit 167 may receive the second switch control signal SW_CNT2, which is activated to have a logic "high" level, to drive the power source voltage VDDS to the second power source voltage VDD2 when the mode signal DVFS_MRS is set to have a logic "high" level by the mode register set operation while the first power source voltage VDD1 is higher than the second power source voltage VDD2.

An operation of the device 100 having an aforementioned configuration will be described hereinafter with reference to FIGS. 6 to 13.

First, the operation of the device 100 performed during the power-up period will be described hereinafter with reference to FIGS. 6 and 7.

Figure 6:
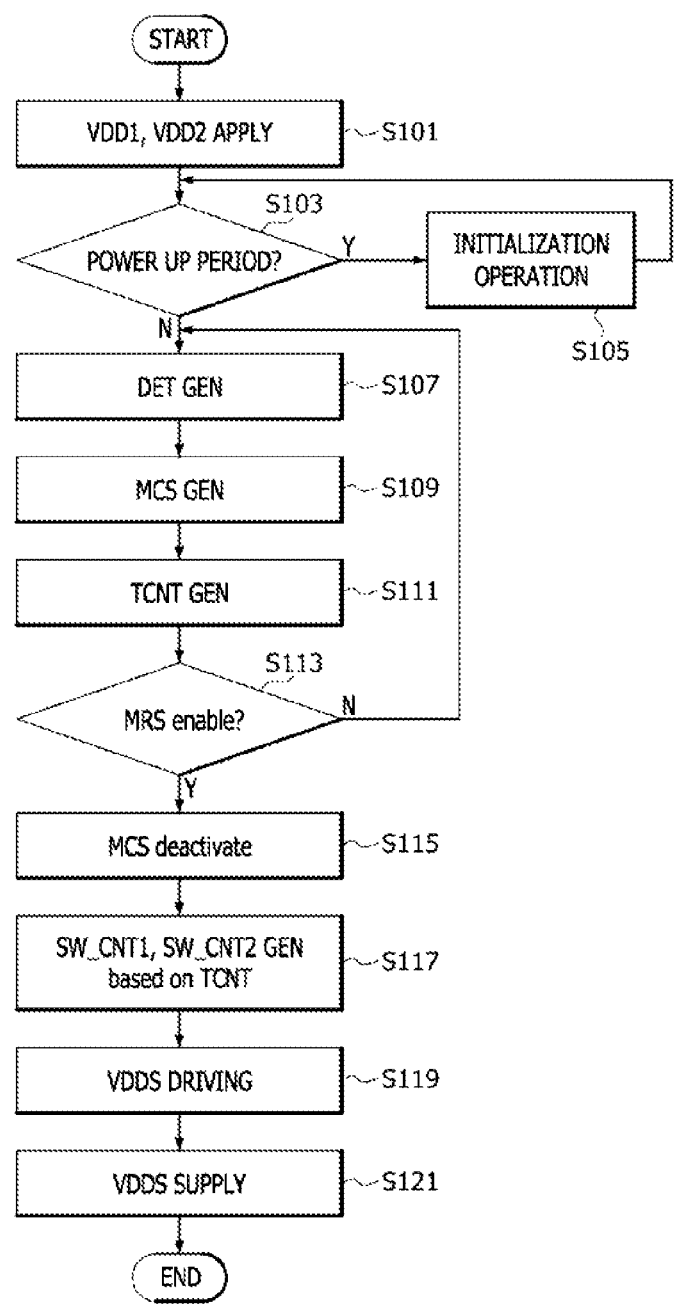

As illustrated in FIG. 6, the first power source voltage VDD1 and the second power source voltage VDD2 may be applied to the device 100 (see a step S101), and whether the first power source voltage VDD1 and the second power source voltage VDD2 are boosted to be higher than the predetermined target level, that is, whether the power-up period is maintained may be verified (see a step S103). While the power-up period is maintained, the initialization operation may be performed (see a step S105).

Figure 7:
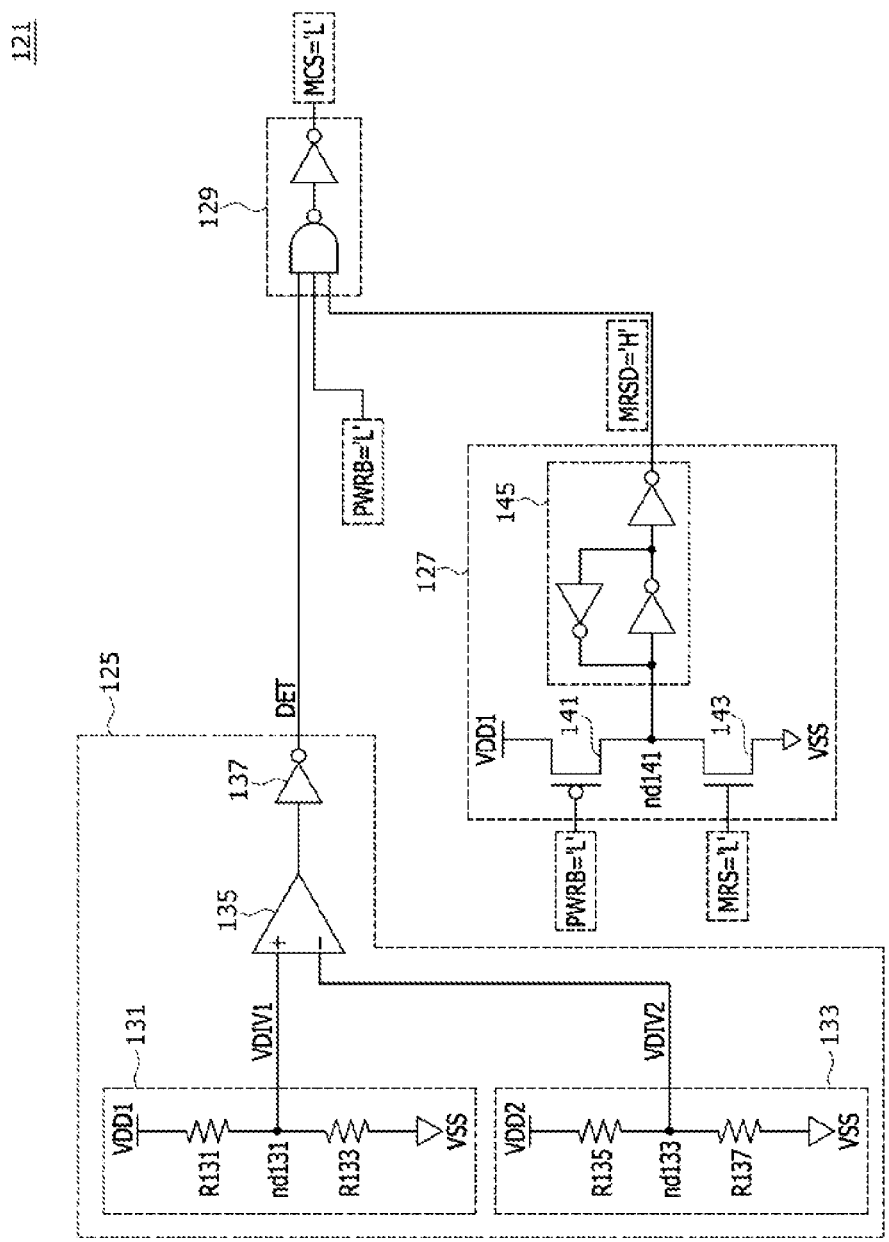
Figure 8:
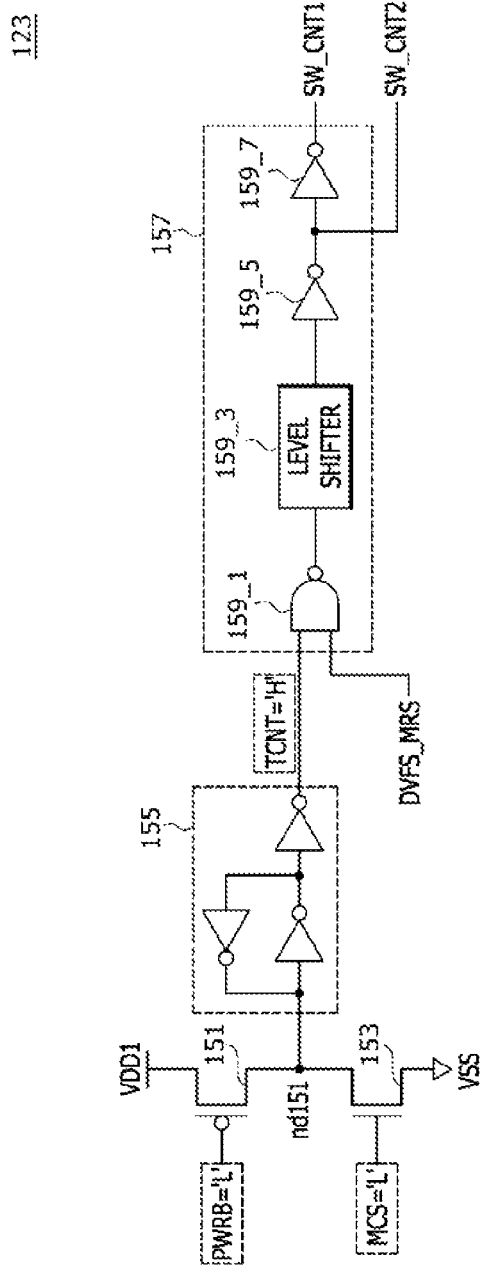

Referring to FIGS. 7 and 8, the initialization operation performed during the power-up period is illustrated. First, as illustrated in FIG. 7, the operation detection signal MRSD may be initialized to have a logic "high(H)" level by the power-up signal PWRB having a logic "low(L)" level during the power-up period in the mode control signal generation circuit 121, and the mode control signal MCS may be initialized to have a logic "low(L)" level. In such a case, the mode register set signal MRS may be inactivated to have a logic "low" level. Next, as illustrated in FIG. 8, the transmission control signal TCNT may be initialized to have a logic "high(H)" level by the power-up signal PWRB having a logic "low(L)" level during the power-up period in the switch control signal drive circuit 123.

As illustrated in FIG. 6, the voltage detection signal DET may be generated according to a comparison result of the first power source voltage VDD1 and the second power source voltage VDD2 until the mode register set operation is performed after the power-up period ends (see a step S107), and the mode control signal MCS may be generated by the voltage detection signal DET (see a step S109). Subsequently, the transmission control signal TCNT may be generated by the mode control signal MCS (see a step S111). Whether the mode register set operation is performed may be determined (see a step S113). The voltage detection signal DET, the mode control signal MCS, and the transmission control signal TCNT may be generated when the non-execution of the mode register set operation is verified at the step S113 (see the step S107, S109, and S111). When the execution of the mode register set operation is verified at the step S113, the mode control signal MCS may be inactivated (see a step S115, MCS deactivated). The first switch control signal SW_CNT1 and the second switch control signal SW_CNT2 may be generated based on the transmission control signal TCNT generated before the mode register set operation is performed (see a step S117). For example, the first switch control signal SW_CNT1 and the second switch control signal SW_CNT2, one of which is selectively activated according to the mode signal DVFS_MRS, may be generated while the transmission control signal TCNT is activated, and the first switch control signal SW_CNT1 which is activated and the second switch control signal SW_CNT2 which is inactivated may be generated regardless of the mode signal DVFS_MRS while the transmission control signal TCNT is inactivated. The power source voltage VDDS may be driven by the first switch control signal SW_CNT1 and the second switch control signal SW_CNT2 (see a step S119), and the power source voltage VDDS may be supplied to the control circuit 110 (see a step S121).

Figure 9:
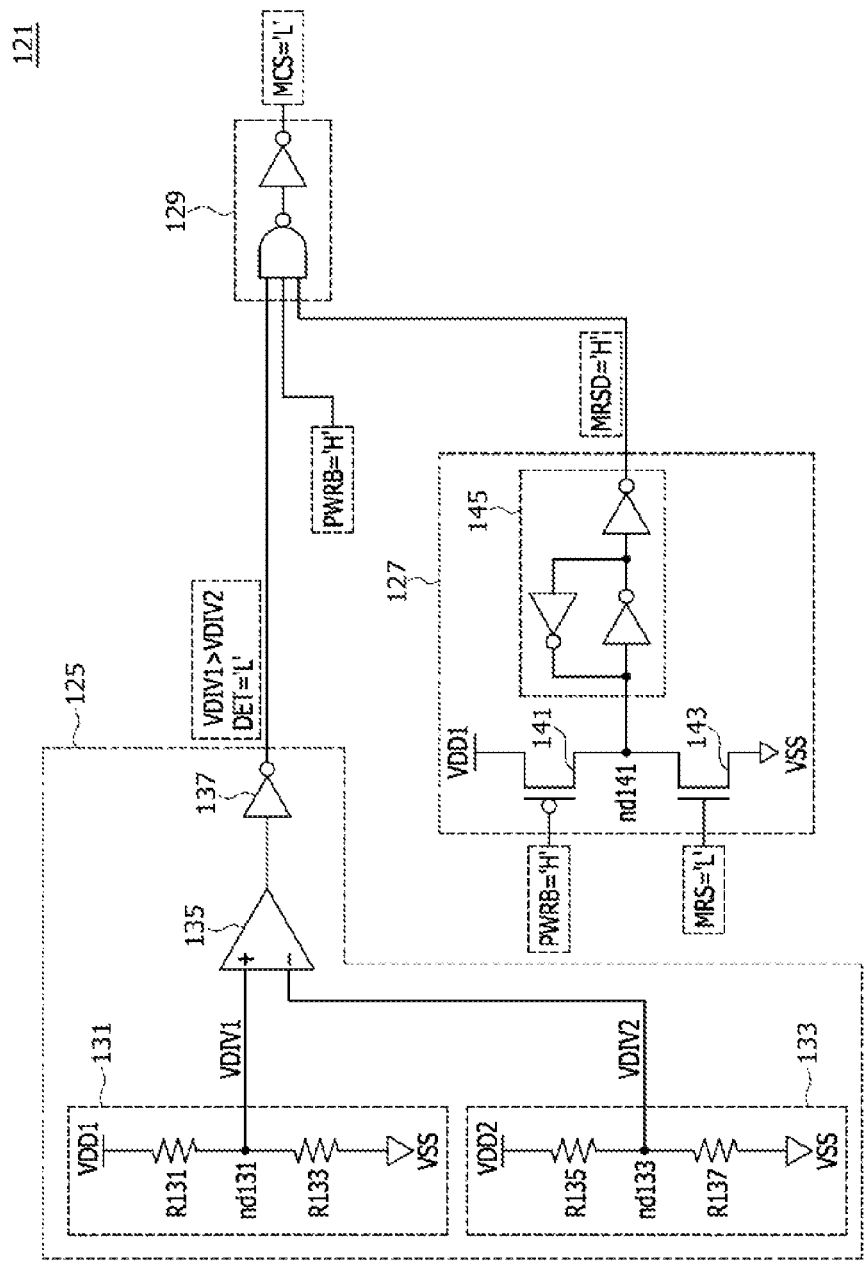
Figure 10:
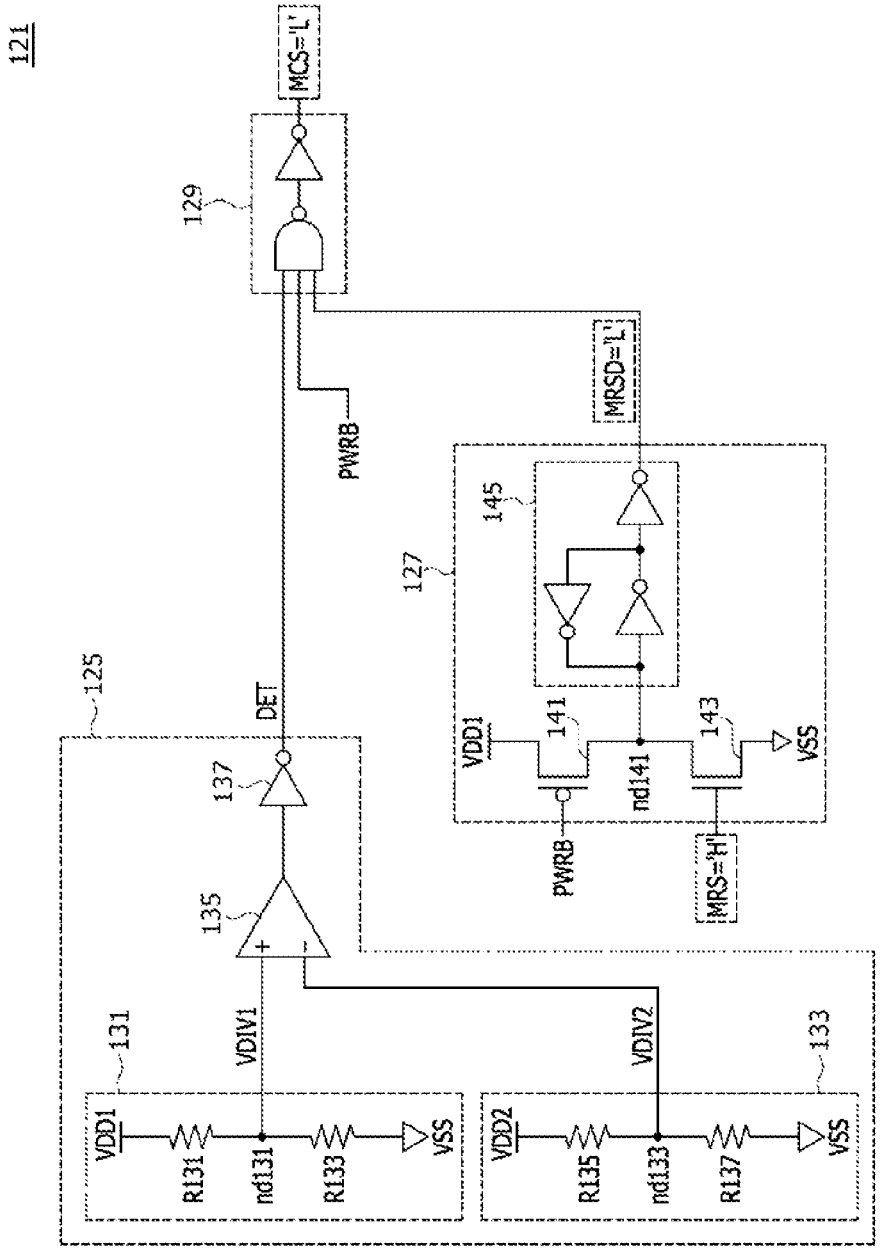

FIGS. 9 to 11 illustrate an operation of the device 100 executed until the mode register set operation is performed after the power-up period ends while the first power source voltage VDD1 is higher than the second power source voltage VDD2. First, as illustrated in FIG. 9, the operation detection signal MRSD may maintain the initialized state corresponding to a logic "high(H)" level by the power-up signal PWRB having a logic "high(H)" level and the mode register set signal MRS having a logic "low(L)" level until the mode register set operation is performed after the power-up period ends in the mode control signal generation circuit 121. Because the first divided voltage VDIV1 is generated to be higher than the second divided voltage VDIV2 to generate the voltage detection signal DET having a logic "low(L)" level, the mode control signal MCS outputted from the mode control signal output circuit 129 may be inactivated to have a logic "low(L)" level. Subsequently, as illustrated in FIG. 10, if the mode register set operation is performed in the mode control signal generation circuit 121, the operation detection signal MRSD may be generated to have a logic "low(L)" level by the mode register set signal MRS having a logic "high(H)" level. Thus, the mode control signal MCS may maintain an inactivated state corresponding to a logic "low(L)" level. Next, as illustrated in FIG. 11, when the transmission control signal TCNT maintains the initialized state corresponding to a logic "high(H)" level based on the mode control signal MCS maintaining an inactivated state, one of the first switch control signal SW_CNT1 and the second switch control signal SW_CNT2 may be selectively activated according to the mode signal DVFS_MRS. For example, when the mode signal DVFS_MRS has a logic "low(L)" level, the first switch control signal SW_CNT1 may be activated to have a logic "high(H)" level so that the power source voltage VDDS is driven to the first power source voltage VDD1. In addition, when the mode signal DVFS_MRS has a logic "high(H)" level, the second switch control signal SW_CNT2 may be activated to have a logic "high(H)" level so that the power source voltage VDDS is driven to the second power source voltage VDD2.

Figure 12:
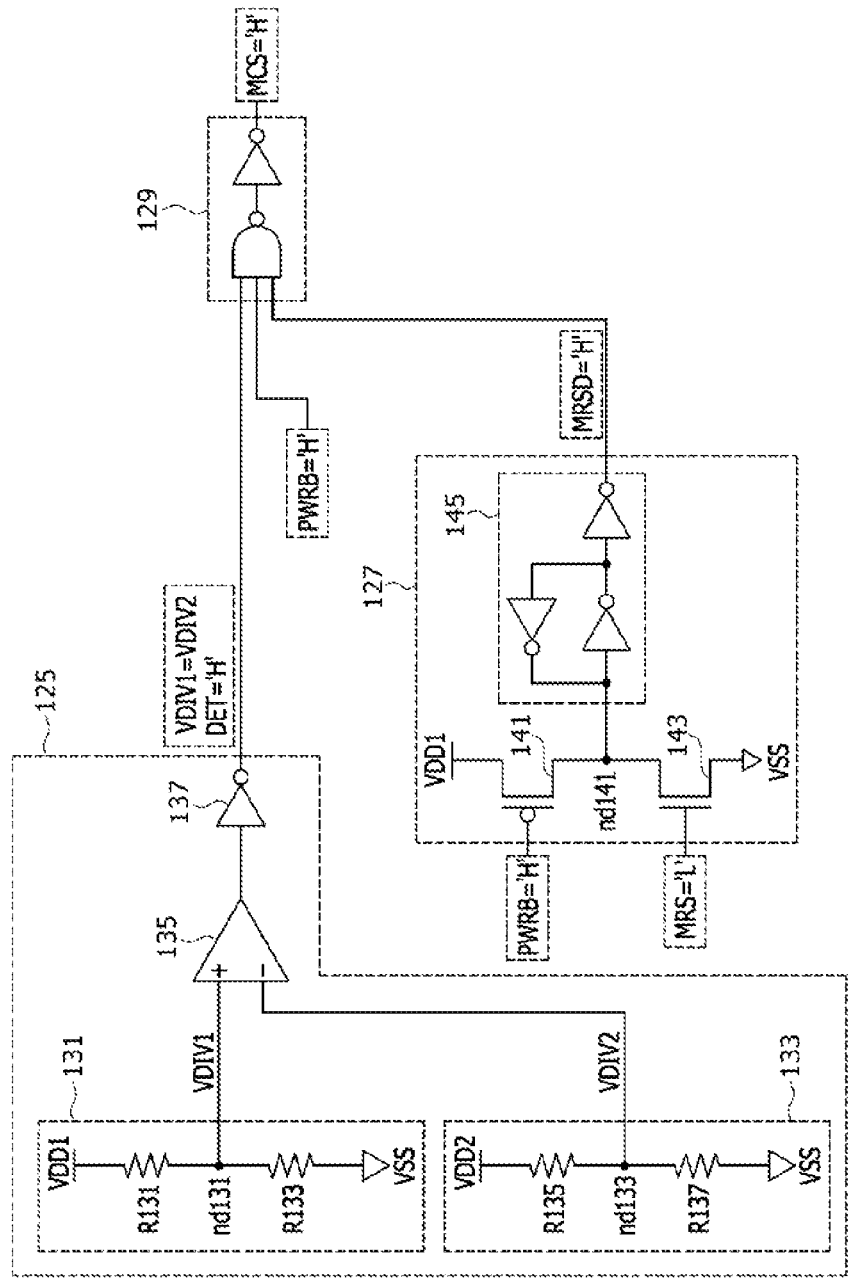
Figure 13:
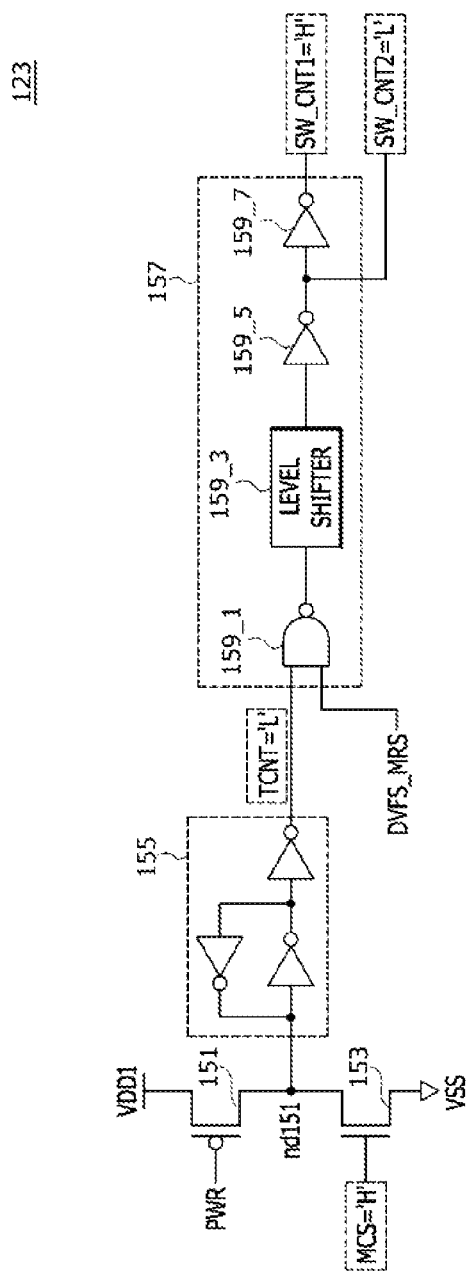

FIGS. 12 and 13 illustrate an operation of the device 100 executed until the mode register set operation is performed after the power-up period ends while the first power source voltage VDD1 and the second power source voltage VDD2 having the same level are applied to the device 100. First, as illustrated in FIG. 12, the operation detection signal MRSD may maintain the initialized state corresponding to a logic "high(H)" level by the power-up signal PWRB having a logic "high(H)" level and the mode register set signal MRS having a logic "low(L)" level until the mode register set operation is performed after the power-up period ends in the mode control signal generation circuit 121. Because the first divided voltage VDIV1 and the second divided voltage VDIV2 are generated to have the same level to generate the voltage detection signal DET having a logic "high(H)" level, the mode control signal MCS outputted from the mode control signal output circuit 129 may be activated to have a logic "high(H)" level. Subsequently, as illustrated in FIG. 13, the transmission control signal TCNT may be inactivated to have a logic "low(L)" level by the mode control signal MCS activated to have a logic "high(H)" level in the switch control signal drive circuit 123. Thus, regardless of the mode signal DVFS_MRS, the first switch control signal SW_CNT1 may be activated to have a logic "high(H)" and the second switch control signal SW_CNT2 may be inactivated to have a logic "low(L)" level.

As described above, the device 100 according to an embodiment of the present disclosure may activate the first switch control signal SW_CNT1 regardless of the mode signal DVFS_MRS while the first power source voltage VDD1 and the second power source voltage VDD2 having the same level are applied to the device 100 and may control the drive of the power source voltage VDDS according to a level of the power source voltage VDDS supplied to the control circuit 110. Accordingly, it may be possible to reduce power consumption of the device 100. In addition, the device 100 may drive a level of the power source voltage VDDS to the first power source voltage VDD1 or the second power source voltage VDD2 according to the mode signal DVFS_MRS and an operation frequency while the first power source voltage VDD1 is higher than the second power source voltage VDD2.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A device comprising:
a switch control signal generation circuit configured to control an operation generating a first switch control signal and a second switch control signal from a mode signal based on a comparison result of a first power source voltage and a second power source voltage until a mode register set operation is performed after a power-up period ends; and
a power gating circuit configured to drive a power source voltage to one of the first power source voltage and the second power source voltage based on the first switch control signal and the second switch control signal.

2. The device of claim 1, wherein the switch control signal generation circuit is configured to generate the first switch control signal which is activated and the second switch control signal which is inactivated when the first power source voltage and the second power source voltage have the same level.

3. The device of claim 1, wherein the switch control signal generation circuit is configured to generate the first switch control signal and the second switch control signal, one of which is selectively activated according to the mode signal when the first power source voltage is higher than the second power source voltage.

4. The device of claim 1, wherein the switch control signal generation circuit includes:
a mode control signal generation circuit configured to generate a mode control signal based on a comparison result of the first power source voltage and the second power source voltage until the mode register set operation is performed after the power-up period ends; and
a switch control signal drive circuit configured to generate the first switch control signal and the second switch control signal based on the mode control signal and the mode signal.

5. The device of claim 4, wherein the mode control signal generation circuit includes:
a voltage detection signal generation circuit configured to compare the first power source voltage with the second power source voltage to generate a voltage detection signal; and
a mode control signal output circuit configured to generate the mode control signal based on the voltage detection signal until the mode register set operation is performed after the power-up period ends.

6. The device of claim 5, wherein the voltage detection signal generation circuit divides the first power source voltage to generate a first divided voltage, divides the second power source voltage to generate a second divided voltage, and compares the first divided voltage with the second divided voltage to generate the voltage detection signal.

7. The device of claim 6, wherein the voltage detection signal generation circuit includes:
a first divided voltage generation circuit including first resistive elements coupled between the first power source voltage and a ground voltage; and
a second divided voltage generation circuit including second resistive elements coupled between the second power source voltage and the ground voltage,
wherein the first and second resistive elements have substantially the same resistance values.

8. The device of claim 5,
wherein the mode control signal output circuit generates the mode control signal based on the voltage detection signal, a power-up signal, and an operation detection signal; and
wherein the operation detection signal is set to have a first logic level when the mode register set operation is performed, and the operation detection signal is initialized to have a second logic level during the power-up period.

9. The device of claim 4, wherein the switch control signal drive circuit is configured to generate the first switch control signal and the second switch control signal, one of which is selectively activated according to the mode signal after the mode register set operation is performed when the mode control signal is activated until the mode register set operation is performed after the power-up period ends.

10. The device of claim 4, wherein the switch control signal drive circuit is configured to generate the first switch control signal which is activated and the second switch control signal which is inactivated after the mode register set operation is performed when the mode control signal is inactivated until the mode register set operation is performed after the power-up period ends.

11. The device of claim 4, wherein the switch control signal drive circuit includes:
   a transmission control signal generation circuit configured to generate a transmission control signal based on a power-up signal and the mode control signal; and
   a switch control signal output circuit configured to generate the first switch control signal and the second switch control signal based on the transmission control signal and the mode signal.

12. The device of claim 1, wherein the power gating circuit is configured to drive the power source voltage to the first power source voltage according to a level of the power source voltage when the first switch control signal is activated and is configured to drive the power source voltage to the second power source voltage when the second switch control signal is activated.

13. The device of claim 1, wherein the power gating circuit includes:
   a power source voltage division circuit configured to divide the power source voltage to generate a divided power source voltage;
   a switch drive signal generation circuit configured to compare a level of the divided power source voltage with a level of a reference voltage based on the first switch control signal to generate a switch drive signal; and
   a first power source voltage drive circuit configured to drive the power source voltage to the first power source voltage based on the switch drive signal.

14. The device of claim 13, wherein the power gating circuit further includes a second power source voltage drive circuit which is configured to drive the power source voltage to the second power source voltage based on the second switch control signal.

15. The device of claim 1, further comprising a mode register configured to extract the mode signal from a set signal to store the mode signal when the mode register set operation is performed,
   wherein the mode signal includes information on a level of the power source voltage which is adjusted according to a frequency.

16. The device of claim 1, further comprising a command decoder configured to generate a mode register set signal based on a set signal,
   wherein the set signal includes a command, and the mode register set operation is performed based on the mode register set signal.

17. The device of claim 1, further comprising a power-up signal generation circuit configured to receive the first power source voltage and the second power source voltage to generate a power-up signal,
   wherein the power-up period is set as a period from a point in time when the first power source voltage and the second power source voltage are applied to the power-up signal generation circuit until a point in time when both of the first power source voltage and the second power source voltage are raised to be higher than a predetermined target level.

18. A device comprising:
   a mode control signal generation circuit configured to generate a mode control signal based on a comparison result of a first power source voltage and a second power source voltage until a mode register set operation is performed after a power-up period ends;
   a switch control signal drive circuit configured to generate a first switch control signal and a second switch control signal based on the mode control signal and a mode signal; and
   a power gating circuit configured to drive a power source voltage to the first power source voltage according to a level of the power source voltage when the first switch control signal is activated and configured to drive the power source voltage to the second power source voltage when the second switch control signal is activated.

19. The device of claim 18, wherein the mode control signal generation circuit includes:
   a voltage detection signal generation circuit configured to compare the first power source voltage with the second power source voltage to generate a voltage detection signal; and
   a mode control signal output circuit configured to generate the mode control signal based on the voltage detection signal until the mode register set operation is performed after the power-up period ends.

20. The device of claim 19, wherein the voltage detection signal generation circuit divides the first power source voltage to generate a first divided voltage, divides the second power source voltage to generate a second divided voltage, and compares the first divided voltage with the second divided voltage to generate the voltage detection signal.

21. The device of claim 19,
   wherein the mode control signal output circuit generates the mode control signal based on the voltage detection signal, a power-up signal, and an operation detection signal; and
   wherein the operation detection signal is set to have a first logic level when the mode register set operation is performed, and the operation detection signal is initialized to have a second logic level during the power-up period.

22. The device of claim 18, wherein the switch control signal drive circuit is configured to generate the first switch control signal and the second switch control signal, one of which is selectively activated according to the mode signal after the mode register set operation is performed when the mode control signal is activated until the mode register set operation is performed after the power-up period ends.

23. The device of claim 18, wherein the switch control signal drive circuit is configured to generate the first switch control signal which is activated and the second switch control signal which is inactivated after the mode register set operation is performed when the mode control signal is inactivated until the mode register set operation is performed after the power-up period ends.

24. The device of claim 18, wherein the switch control signal drive circuit includes:
   a transmission control signal generation circuit configured to generate a transmission control signal based on a power-up signal and the mode control signal; and
   a switch control signal output circuit configured to generate the first switch control signal and the second switch control signal based on the transmission control signal and the mode signal.

* * * * *